US006867138B2

(12) United States Patent
Miyashita et al.

(10) Patent No.: US 6,867,138 B2
(45) Date of Patent: Mar. 15, 2005

(54) METHOD OF CHEMICAL/MECHANICAL POLISHING OF THE SURFACE OF SEMICONDUCTOR DEVICE (75) Inventors: Naoto Miyashita, Yokohama (JP); Takeshi Nishioka, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 10/217,646

(22) Filed: Aug. 14, 2002

(65) Prior Publication Data

US 2002/0192962 A1 Dec. 19, 2002

Related U.S. Application Data

(63) Continuation of application No. 09/655,918, filed on Sep. 6, 2000, now Pat. No. 6,468,911.

(30) Foreign Application Priority Data

Sep. 8, 1999 (JP) ............................................. 11-254565

(51) Int. Cl.[7] ............................................... H01L 21/20
(52) U.S. Cl. ...................... 438/691; 438/692; 438/693; 438/745; 156/345.12; 216/38; 216/88; 216/89; 216/91
(58) Field of Search ................................ 438/691, 692, 438/693, 745; 156/345.12; 216/38, 88, 89, 91

(56) References Cited

U.S. PATENT DOCUMENTS 5,976,000 A * 11/1999 Hudson ....................... 451/534
5,981,394 A * 11/1999 Ohashi et al. ............... 438/692
6,046,111 A    4/2000 Robinson
6,174,766 B1 * 1/2001 Hayashi et al. .............. 438/241
6,224,464 B1   5/2001 Nojo et al.
6,241,581 B1 * 6/2001 Miyashita et al. ............ 451/41
6,354,913 B1 * 3/2002 Miyashita et al. ............ 451/41
6,468,911 B1 * 10/2002 Miyashita et al. .......... 438/692

FOREIGN PATENT DOCUMENTS

| JP | 10-242090 | 9/1988 |
| JP | 2-6586 | 1/1990 |
| JP | 7-221067 | 8/1995 |
| JP | 8-22970 | 1/1996 |
| JP | 9-57611 | 3/1997 |
| JP | 10-4070 | 1/1998 |
| JP | 10-286756 | * 10/1998 |
| JP | 10-286757 | 10/1998 |
| JP | 11-251276 | 9/1999 |

* cited by examiner

Primary Examiner—Robert Kunemund
(74) Attorney, Agent, or Firm—Finnegan, Henderson, Farabow, Garrett & Dunner, L.L.P.

(57) ABSTRACT

The surface of a semiconductor device is polished by first supplying a polishing pad with a slurry that contains a solvent, abrasive grains, and an additive for making the viscosity of the slurry variable so that the top portion of the polishing pad is soaked with the slurry, then supplying the polishing pad with a viscosity modifier for increasing the viscosity of the slurry and hardening the top portion of the polishing pad soaked with the slurry, and finally polishing the surface of the semiconductor device with the slurry having its viscosity increased and the polishing pad having its top portion hardened.

10 Claims, 10 Drawing Sheets

METHOD OF CHEMICAL/MECHANICAL POLISHING OF THE SURFACE OF SEMICONDUCTOR DEVICE

This is a continuation of application Ser. No. 09/655,918 filed on Sep. 6, 2000 now U.S. Pat. No. 6,468,911.

CROSS-REFERENCE TO RELATED APPLICATIONS

This application is based upon and claims the benefit of priority from the prior Japanese Patent Application No. 11-254565, filed Sep. 8, 1999, the entire contents of which are incorporated herein by reference.

BACKGROUND OF THE INVENTION

The present invention generally relates to a method of manufacturing a semiconductor device and more particularly to methods of chemical/mechanical polishing of the surface of a semiconductor device.

The chemical/mechanical polishing (CMP) has been used for planarization of interlayer insulating films, metal interconnections, polysilicon filling device isolation trenches, etc.

In planarizing polysilicon by CMP, a stopper film consisting of silicon dioxide or nitride silicon is used in order to stop the progress of polishing after planarization. In this case, it is required to polish polysilicon selectively in comparison with the stopper film.

Figure 1:
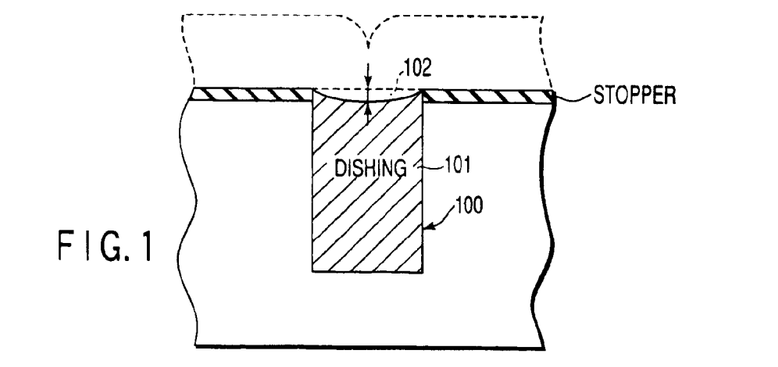
FIG. 1 is a sectional view of a semiconductor device illustrating the dishing.

In the CMP, however, polishing/etching is performed based on the combined action of the chemical action of a polishing slurry and the mechanical action of abrasive grains. Depending on selected polishing conditions, therefore, "dishing" may occur. The "dishing" means that a recess 102 is formed, as shown in FIG. 1, on top of polysilicon 101 that fills a trench 100 after polishing. The occurrence of the "dishing" causes a degradation in the device performance, a reduction in the device yield, and a decrease in the device reliability.

In particular, the "dishing" remarkably occurs in wide trenches when trenches of different widths are simultaneously filled with polysilicon (at a rate more than twenty times that for narrow trenches). It is thought that the dishing occurs due to deformation of a polishing pad and a difference in polishing rate between polysilicon and stopper film. An improvement can be made through the use of a polishing pad of high elastic modulus and a fixed abrasive grain type of grinding stone.

Figure 2:
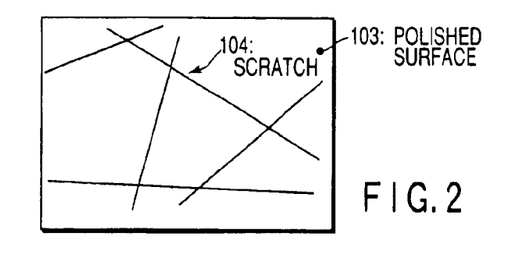
FIG. 2 is a plan view of a semiconductor device illustrating the scratching.

However, since the polishing pad of high elastic modulus and the fixed abrasive grain type of grinding stone are stiff, it is known that a load is concentrated on a portion of abrasive grains at CMP time and consequently scratching becomes easy to occur on the polished surface of a semiconductor device. The "scratching" means that the polished surface 103 of the semiconductor device gets scratches 104 as shown in FIG. 2. As is the case with the "dishing", the occurrence of the "scratching" causes a degradation in the device performance, a reduction in the device yield, and a decrease in the device reliability.

It is said that the stiff polishing pad is not suited for polishing semiconductor devices because it, while being capable of suppressing the dishing, makes the scratching easy to occur.

BRIEF SUMMARY OF THE INVENTION

It is therefore an object of the present invention to provide a semiconductor device chemical/mechanical polishing method which permits the dishing to be controlled while keeping the scratches from increasing.

To attain the object, according to an aspect of the present invention there is provided a chemical/mechanical polishing method of polishing the surface of a semiconductor device comprising the steps of: supplying a polishing pad with a slurry that contains a solvent, abrasive grains, and an additive for making viscosity variable so that the top portion of the polishing pad is soaked with the slurry; supplying the polishing pad with a viscosity modifier for increasing the viscosity of the slurry and hardening the top portion of the polishing pad soaked with the slurry to a given level of hardness; and polishing the surface of the semiconductor device with the slurry having its viscosity increased and the polishing pad having its top portion hardened.

According to another aspect of the present invention there is provided a chemical/mechanical polishing method of polishing the surface of a semiconductor device comprising: a first step of supplying a polishing pad with a slurry that contains a solvent, abrasive grains, and an additive for making viscosity variable so that the top portion of the polishing pad is soaked with the slurry; a second step of, after the first step, polishing the surface of the semiconductor device with the top portion of the polishing pad soaked with the slurry; a third step of supplying the polishing pad with a viscosity modifier for increasing the viscosity of the slurry and hardening the top portion of the polishing pad soaked with the slurry to a given level of hardness; and a fourth step of, after the third step, polishing the surface of the semiconductor device with the slurry having its viscosity increased and the polishing pad having its top portion hardened.

According to the chemical/mechanical polishing methods, since the to-be-polished surface of the semiconductor device is polished with the hardened top portion of the polishing pad, the polishing pad is difficult to deform and hence the dishing is controlled.

In addition, since the to-be-polished surface of the semiconductor device is polished with the slurry with increased viscosity, the polishing pad slips on a layer of slurry after the surface has been flattened and has difficulty contacting with the polished surface. Thus, the progress of the chemical/mechanical polishing is impeded after the polished surface has been flattened and consequently the dishing is controlled.

Moreover, since the progress of the chemical/mechanical polishing is impeded after the polished surface has been flattened, the scratches produced on the polished surface is kept from increasing.

Furthermore, the viscosity of the slurry is increased on the polishing pad by supplying the polishing pad with the viscosity modifier. Thus, the top portion of the polishing pad can be hardened in a state where it is deformed to conform to a warp in the polished surface of the semiconductor device, which allows an improvement in global flatness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described hereinafter with reference to the accompanying drawings, wherein like reference characters designate like parts throughout all the views.

Figure 3:
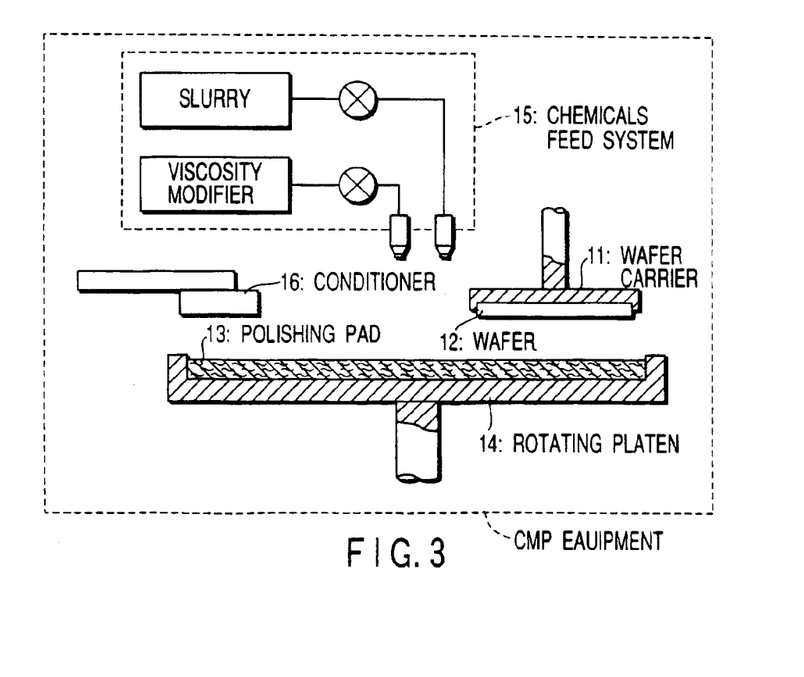
FIG. 3 is a schematic representation of CMP equipment used in a CMP process according to an embodiment of the present invention.

First, reference is made to FIG. 3 to describe CMP equipment used in the CMP process according to an embodiment of the present invention.

As shown in FIG. 3, a wafer carrier 11 holds a wafer 12. The wafer 12 is held by the carrier 11 so that its to-be-polished surface is opposed to a polishing pad 13. The polishing pad 13 is mounted on a rotating platen 14. In this embodiment, the polishing pad 13 may be a conventionally used one. For example, the polishing pad 13 is preferably formed of a foam material consisting of, say, polyurethane, non-woven fabric consisting of, say, polyester fiber, or a stacked structure of these materials.

Above the rotating platen 14 is provided a chemicals feed system 15 which feeds the polishing pad 13 with chemicals. In this embodiment, the chemicals comprise a slurry that contains a solvent, abrasive grains, and an additive that makes the viscosity variable, and a viscosity modifier that adjusts the viscosity of the slurry.

A conditioner 16 is used to condition the polishing pad 13 which has been worn or clogged by polishing to thereby recycle it.

The above is the summary of the CMP equipment.

A CMP process according to an embodiment of the present invention will be described below in detail.

FIGS. 4 through 7 illustrate main steps in the CMP process.

Figure 4:
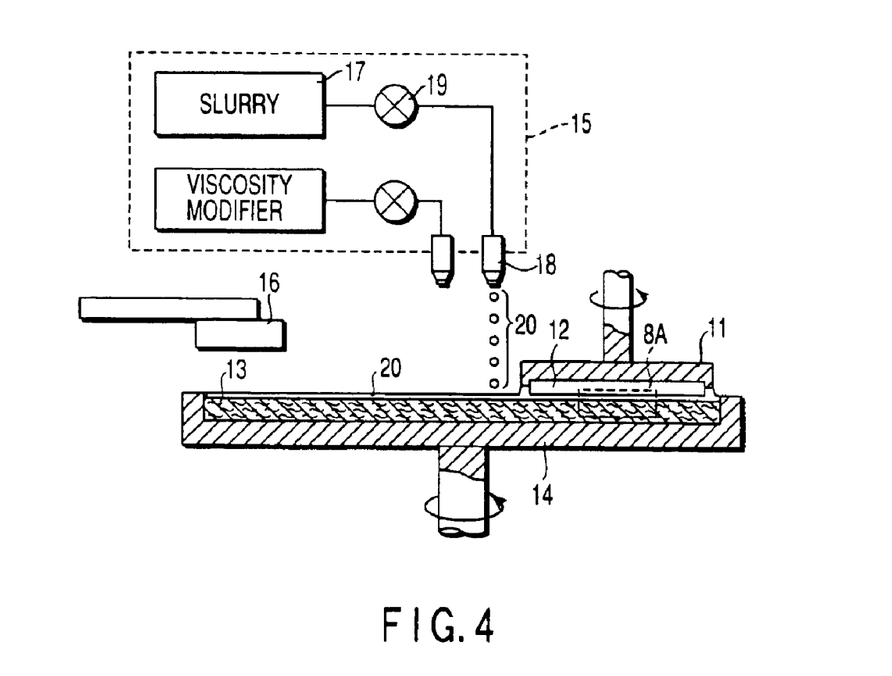
FIGS. 4 to 7 show main steps in the CMP process.

First, as shown in FIG. 4, the polishing pad 13 is mounted on the rotating platen 14. The wafer 12 is held on the wafer carrier 11. Next, the rotating platen 14 is rotated as indicated by an arrow. A valve 19 provided between a slurry vessel 17 and a nozzle 18 in the slurry feed system 15 is opened to supply the slurry 20 to the polishing pad 13. The polishing slurry 20 is one in which a water-soluble high polymer as an agent for making the viscosity variable is added to an inorganic alkaline aqueous solution which has colloidal silica suspended as abrasive grains. An example of the inorganic alkaline solution is an ammonia solution, and an example of the water-soluble high polymer is hydroxycellulose.

The slurry 20 spreads over the whole of the polishing pad 13 and then wafer carrier 11 is moved over the polishing pad and lowered. Thereby, the to-be-polished surface of the wafer 12 is brought into contact with the slurry 20 and the polishing pad 13.

Figure 8A:
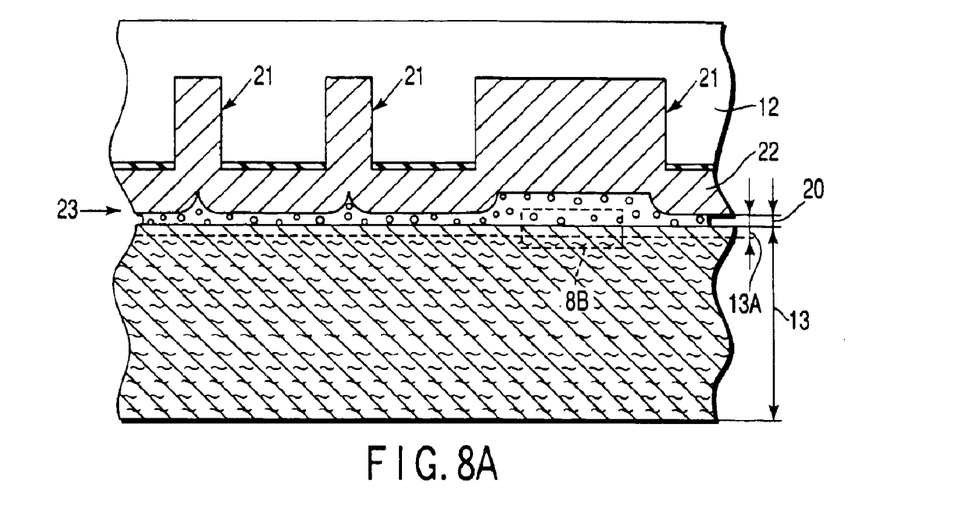
FIG. 8A is an enlarged view of a portion 8A indicated by broken lines in FIG. 4.

A portion 8A indicated by broken lines in FIG. 4 is shown enlarged in FIG. 8A.

As shown in FIG. 8A, the wafer 12 is formed with a plurality of trenches 21 each of which is filled with polysilicon 22. The surface of the polysilicon 22 that fills the trenches 21, i.e., the to-be-polished surface 23, has steps. A layer of slurry 20 is considered to exist between the to-be-polished surface 23 and the polishing pad 13. A portion 8B indicated by broken lines in FIG. 8A is shown enlarged in FIG. 8B.

Figure 8B:
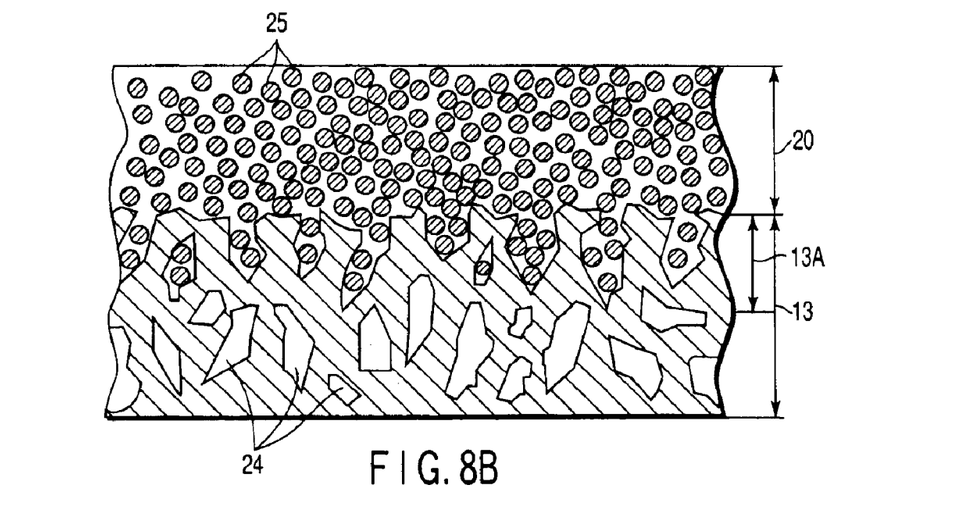
FIG. 8B is an enlarged view of a portion 8B indicated by broken lines in FIG. 8A.

As shown in FIG. 8B, the polishing pad 13 has small spaces between fibers, or numberless small bubbles 24. The slurry 20 soaks into the polishing pad 13 through the small bubbles 24, whereby the top 13A of the polishing pad 13 is wet with the slurry 20. In the drawing, 25 denotes colloidal silica suspended in the slurry as abrasive grains.

Figure 12:
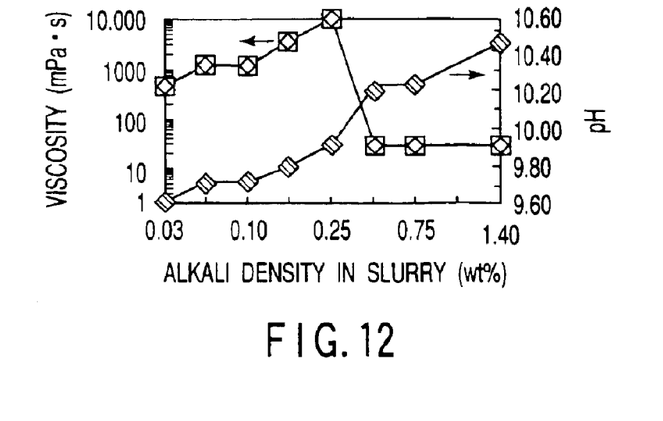
FIG. 12 shows plots of the slurry viscosity and the slurry pH against the alkali density in the slurry.

FIG. 12 is a graph illustrating the characteristics of the slurry 20. In FIG. 12, the viscosity and pH of the slurry 20 are plotted against the alkali density in the slurry.

At the stage of FIGS. 4, 8A and 8B, the alkali density in the slurry has been adjusted to a value in excess of about 0.5 (wt %) in FIG. 12. The pH of the slurry is in excess of about 10. The viscosity of the slurry is about 20 (mPa·s) and smooth.

Figure 5:
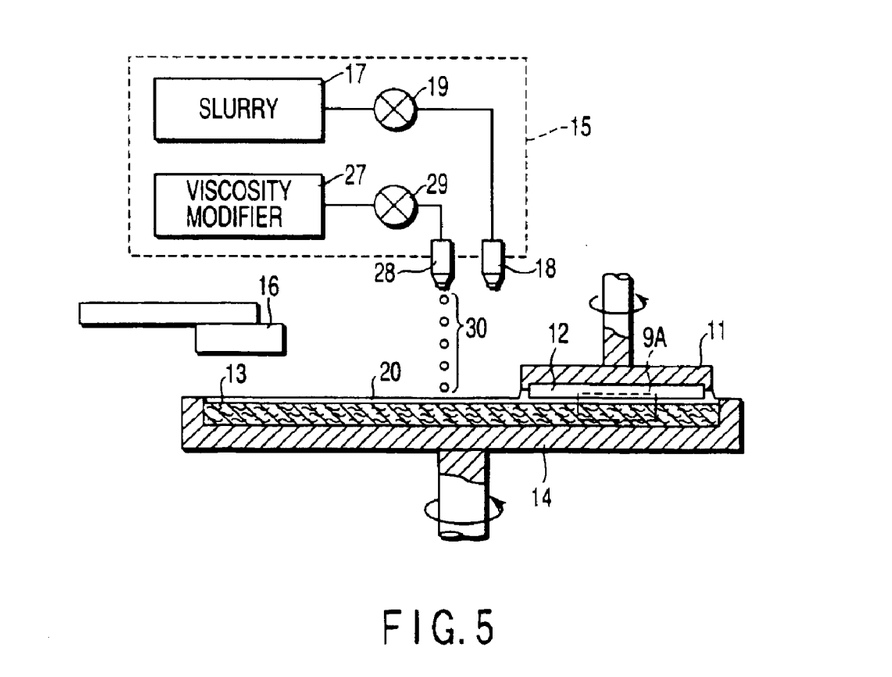

Next, as shown in FIG. 5, a valve 29 provided between a viscosity modifier vessel 27 and a nozzle 28 in the chemicals feed system 15 is opened to supply a viscosity modifier 30 to the polishing pad 13. An example of the viscosity modifier is pure water. By the viscosity modifier the alkali density in the slurry is diluted to a value less than about 0.5 (wt %) on the polishing pad 13. As a result, the pH of the slurry is decreased below about 10 as shown in FIG. 12. On the other hand, the viscosity increases from about 20 to 300–10000 (mPa·s). Thereby, the slurry 20 changes from a smooth state to a viscous state. This is expected to be a result of gelation of the high polymer contained in the slurry 20. Particularly when the alkali density in the slurry is 0.25 (wt %), the viscosity abruptly increases to about 10000 (mPa·s). After that, the viscosity decreases as the alkali density decreases. This is expected to be a result of agglutination and separation of gelled high polymers.

Figure 9A:
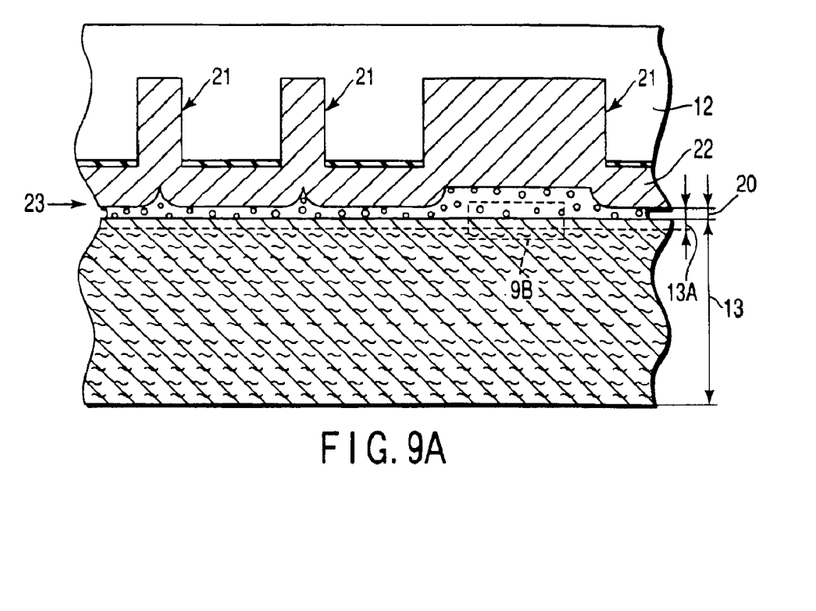
FIG. 9A is an enlarged view of a portion 9A indicated by broken lines in FIG. 5.

A portion 9A indicated dotted in FIG. 5 is shown enlarged in FIG. 9A. A portion 9B indicated dotted in FIG. 9A is shown enlarged in FIG. 9B.

Figure 9B:
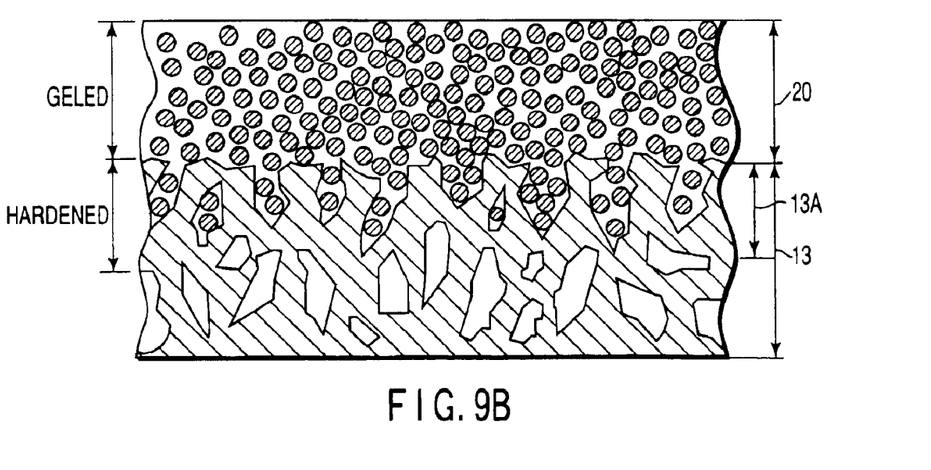
FIG. 9B is an enlarged view of a portion 9B indicated by broken lines in FIG. 9A.

As shown in FIGS. 9A and 9B, the slurry 20 becomes gelled as a result of being diluted. At the same time, the top portion 13A of the polishing pad 13 is hardened to a predetermined level as a result of gelation of the slurry 20. For example, the hardness of the polishing pad prior to gelation of the slurry is about 55 (Shore D hardness). In contrast, the hardness of the polishing pad after the gelation of the slurry 20 is increased to a hardness in excess of 55.

Although, in FIG. 5, the supply of the slurry 20 is stopped, the viscosity modifier 30 may be supplied to the polishing pad 13 while the slurry is being supplied to the polishing pad.

Figure 6:
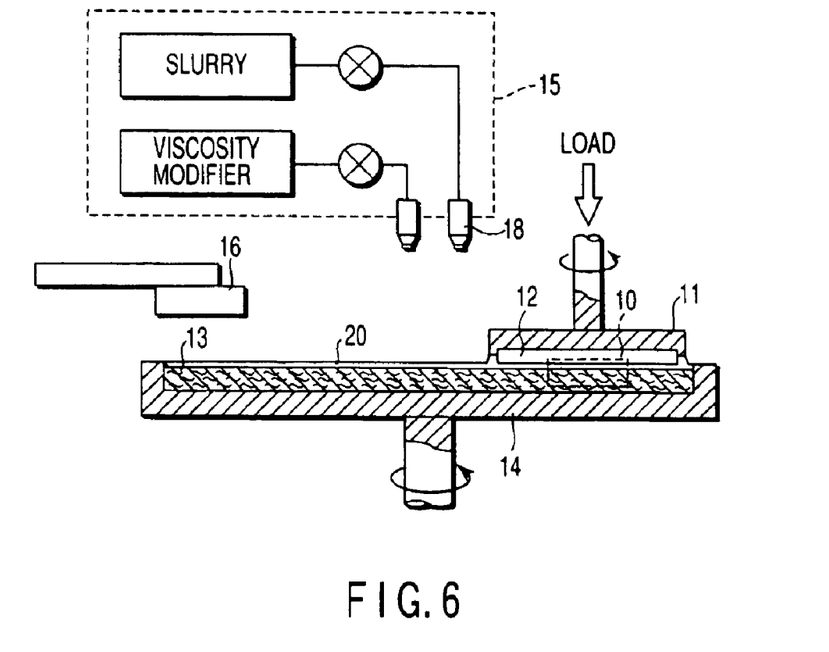
Figure 10A:
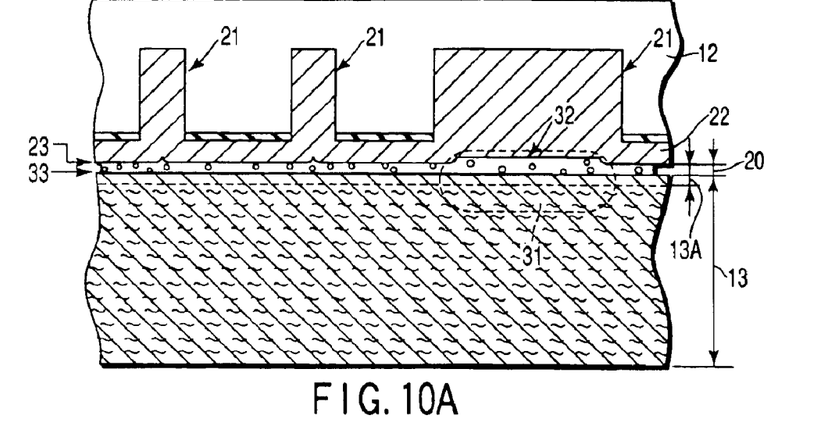
FIG. 10A is an enlarged view of a portion 10 indicated by broken lines in FIG. 6 from the beginning to the middle of the CMP process.

Next, as shown in FIG. 6, the wafer carrier 11 is subjected to a load to chemically/mechanically polish the surface of the wafer 12 using the viscosity-increased slurry 20 and the hardened top portion of the polishing pad 13. A portion 10 indicated dotted in FIG. 6 is shown enlarged in FIGS. 10A and 10B. FIG. 10A shows the state from the beginning to the middle of the CMP process and FIG. 10B shows the state at the end of the CMP process.

Figure 10B:
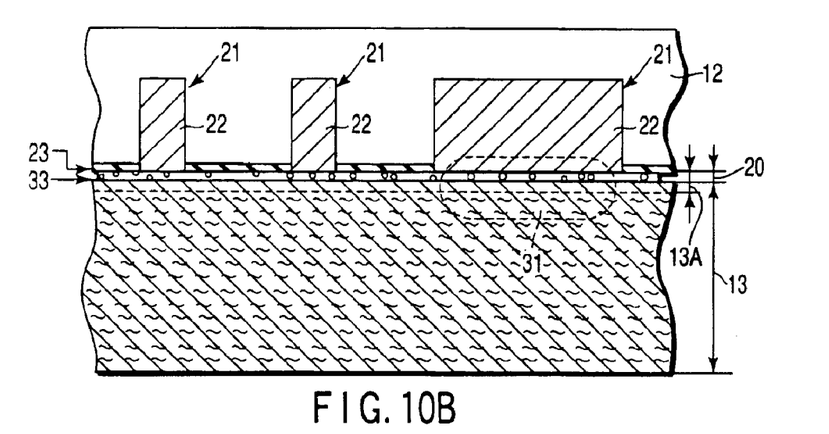
FIG. 10B is an enlarged view of a portion 10 indicated by broken lines in FIG. 6 from the middle to the end of the CMP process.

As shown in FIGS. 10A and 10B, protrusions on the surface 23 of the wafer 12 are chemically/mechanically polished intensively at the initial and intermediate stages of the CMP process. At the final stage, the surface 23 becomes smoothed.

Although, in FIG. 6, the supply of the slurry 20 and the viscosity modifier 30 is stopped, the CMP process may be performed while supplying at least one of the slurry and the viscosity modifier to the polishing pad 13.

Figure 7:
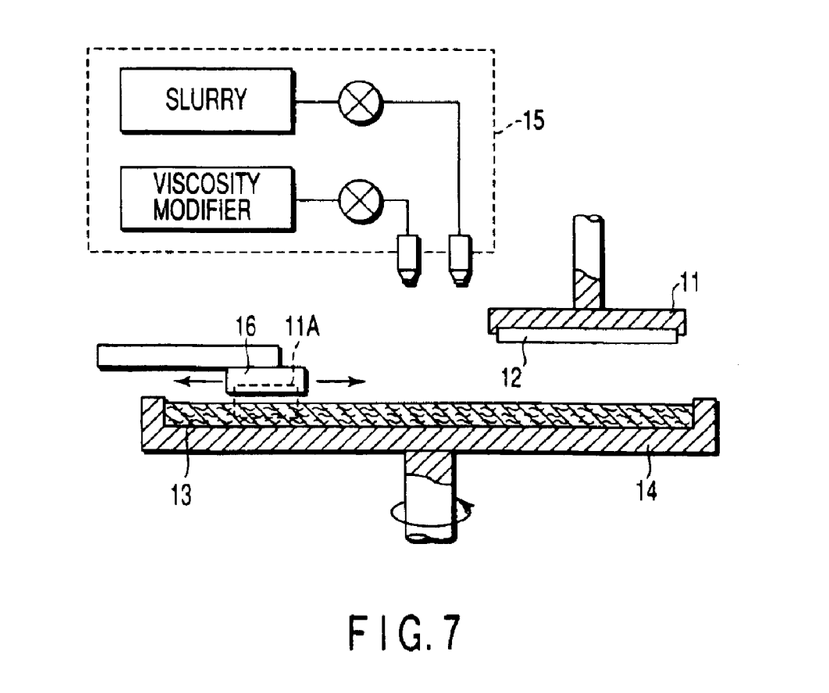

After that, as shown in FIG. 7, the wafer 12 for which the CMP process has terminated is separated from the polishing pad 13. The polishing pad is then recycled using the conditioner 16. A portion 11A indicated dotted in FIG. 7 is shown enlarged in FIG. 11.

Figure 11:
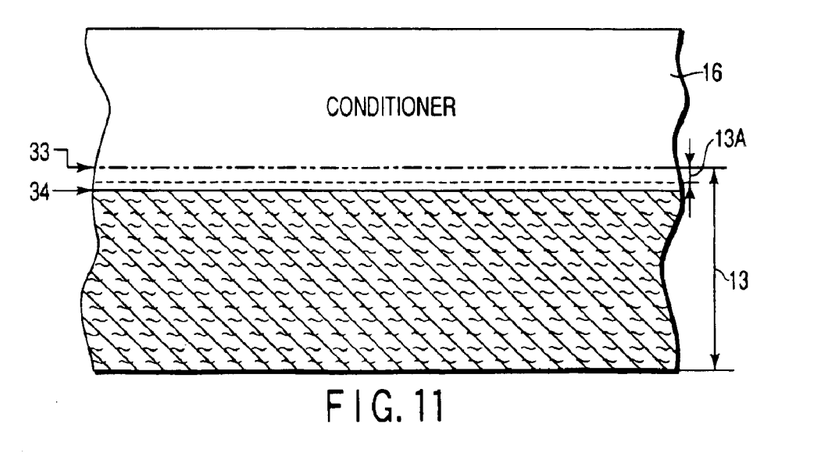
FIG. 11 is an enlarged view of a portion 11A indicated by broken lines in FIG. 7.

As shown in FIG. 11, the conditioning is performed in such a way as to remove the hardened top portion of the polishing pad through the use of any of a brush, a diamond dress, and a jet of water. By removing the hardened top portion in this manner, a non-hardened portion of the polishing pad 13 becomes exposed. Thus, the polishing pad can be restored for reuse in the above-described CMP process. In FIG. 11, 34 denotes the recycled surface of the polishing pad.

In this way, the CMP process according to an embodiment of the present invention comes to an end.

The advantages of the present invention will be described next.

Figure 13:
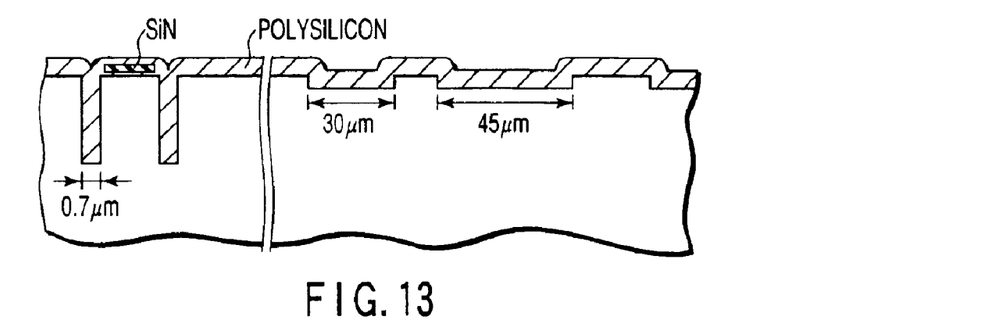
FIG. 13 is a schematic sectional view of a wafer having a pattern of steps used in an experiment.

FIG. 13 is a schematic sectional view of a wafer used in an experiment.

Figure 14:
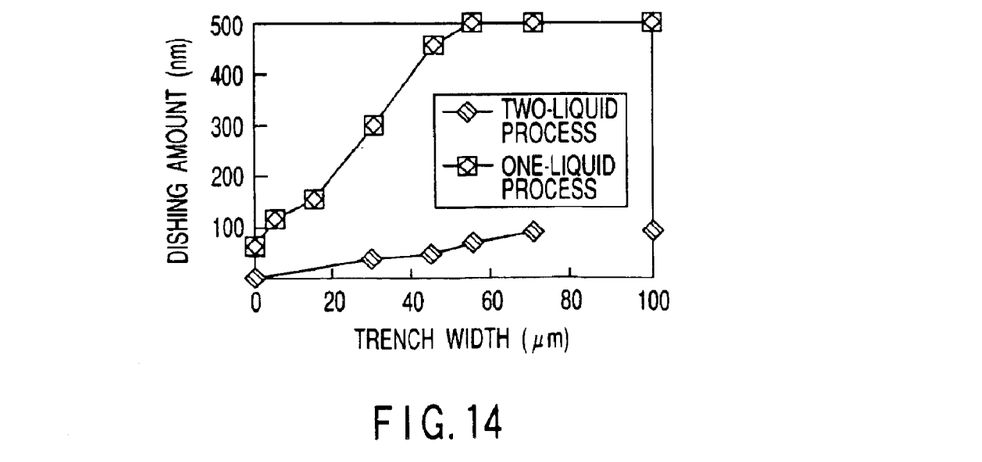
FIG. 14 is a plot of the amount of dishing against the trench width in the wafer of FIG. 13.

As shown in FIG. 13, the wafer was formed on top with trenches 0.7 μm in width and 5 μm in length (in the direction perpendicular to drawing paper) and square trenches 30 μm, 45 μm, 55 μm, 70 μm and 100 μm on a side. These trenches were filled with polysilicon deposited by means of LP-CVD. Such a wafer was used for experiment. The amount of dishing was measured with a commercially available surface roughness measuring equipment by sensing pin. In FIG. 14, the amount of dishing is plotted against the trench width.

In FIG. 14, "one-liquid process" corresponds to a prior art in which only an inorganic alkaline solution having colloidal silica suspended is used as a slurry. "Two-liquid process" corresponds to the aforementioned embodiment in which an inorganic alkaline solution having colloidal silica suspended is added with hydroxycellulose and diluted with pure water on the polishing pad.

As shown in FIG. 14, with the "one-liquid process", the amount of dishing was of the order of 500 nm for trench width of more than 50 μm. With the "two-liquid process", on the other hand, the amount of dishing is as small as 100 nm even for a trench width of 100 μm.

Thus, according to the embodiment, the amount of dishing can be reduced considerably. The following reasons will be considered:

First, as shown in FIG. 10A, the surface features are polished intensively by the slurry 20 and the polishing pad 13 from the beginning to the middle of the CMP process.

At this point, in this embodiment, the top portion 13A of the polishing pad 13 has been hardened. For this reason, the polishing surface 33 of the polishing pad 13 can be expected to have become difficult to deform in comparison with the prior art in which the top portion is not hardened.

In particular, as indicated in a portion 31 shown dotted, the deformation of that portion of the polishing surface 33 of the polishing pad 13 which is opposed to a recess 32 in a wide trench 21 is suppressed. Thus, the dishing resulting from deformation of the polishing surface 33 of the polishing pad 13 is expected to be suppressed.

Also, it may be supposed that the suppression of dishing relates to the following:

As shown in FIG. 10B, at the end of the CMP process, the polished surface 23 becomes smoothed. This results in a state where a layer of slurry is present between the smooth surface 23 and the polishing surface 33 of the polishing pad 13. The layer of slurry sandwiched between the polished surface 23 and the polishing surface 33 is subjected to shearing. A pressure is produced in the slurry layer subjected to shearing. This pressure is low if the viscosity of the slurry is substantially the same as that of water (several mPa·s). That the pressure is low means that the slurry layer greatly deforms. If the slurry layer deforms greatly, then the polishing surface 33 will easily come into contact with the polished surface 23.

In this embodiment, however, the slurry 20 has a viscosity of, say, 100 mPa·s or more. In this case, the pressure produced in the layer of slurry 20 is high, which means that the layer of slurry is difficult to deform. It may be supposed that the polishing surface 33 of the polishing pad is slipping on the layer of slurry 20. In particular, this phenomenon arises more remarkably as the polished surface 23 is smoother. (see T. Nishioka, et al., Proc. of Internal Interconnect Technology Conf., p 89 (1999)).

Thus, if a layer of slurry 20 is produced and the polishing surface 33 of the polishing pad slips on the slurry layer, then it will become difficult for the polishing surface 33 to come into contact with the polished surface 23 of the wafer. In such a situation, the further progress of the polishing will be impeded, which is expected to keep the dishing from increasing.

Further, the scratches produced on the polished surface 23 can be kept from increasing because of the difficulty in bringing the polishing surface 33 into contact with the polished surface 23 at the end of the CMP process.

In order to enhance those effects, it is desired to increase the viscosity of the slurry 20 after viscosity adjustment.

For example, in the case of the inorganic alkaline solution (ammonia solution) added with hydroxycellulose, the alkali density of the slurry 20 prior to viscosity adjustment is set to 0.5 (wt %) or more (the pH is 10.2 or more). It is desirable that an adjustment be made so that the alkali density of the slurry becomes 0.25 (wt %) (the pH is 10 or less).

In addition, in this embodiment, the slurry viscosity is changed on the polishing pad 13, which provides the following advantages in comparison with a polishing pad higher in modulus than normal ones and a grinding stone of the fixed abrasive grain type.

Figure 15A:
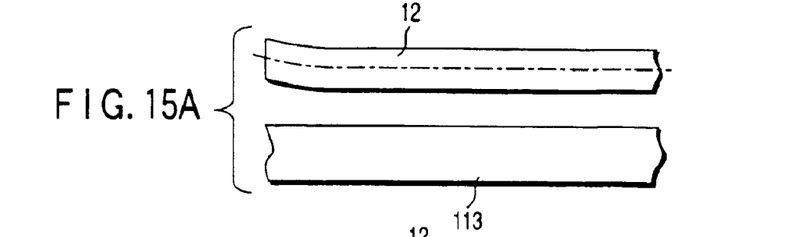
FIGS. 15A, 15B and 15C are schematic side views illustrating a relationship between a grinding stone of the fixed abrasive grain type and a warp in a wafer.
Figure 15B:
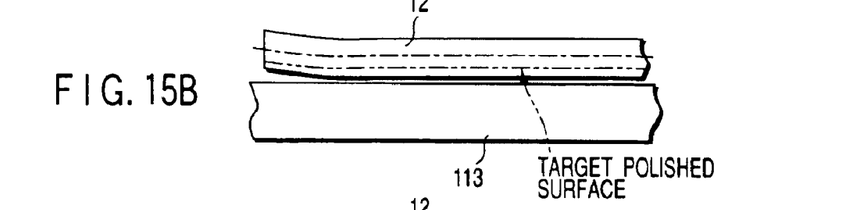
Figure 15C:
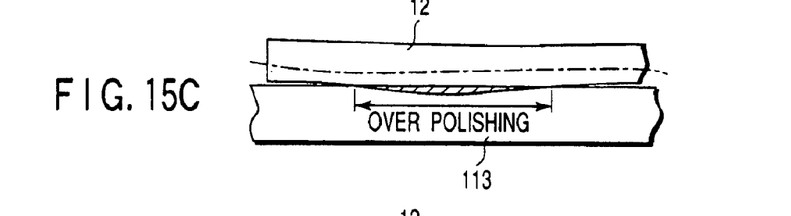
Figure 16A:
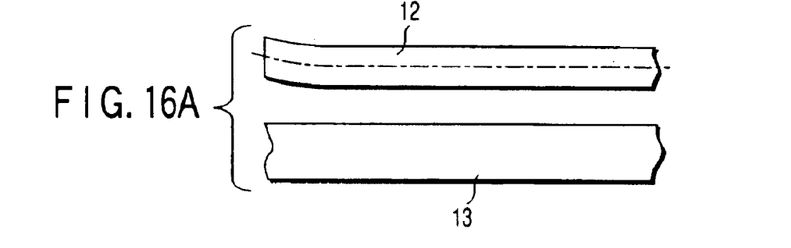
FIGS. 16A, 16B and 16C are schematic side views illustrating a relationship between a polishing pad and a warp in a wafer in the CMP process according to an embodiment of the present invention.
Figure 16B:
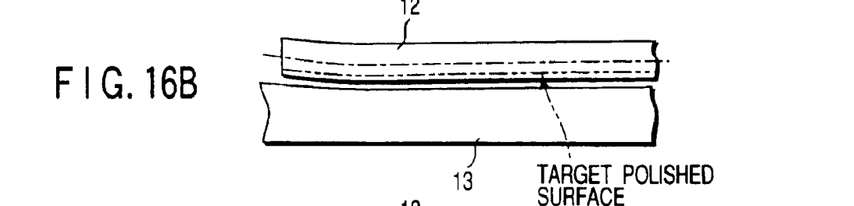
Figure 16C:
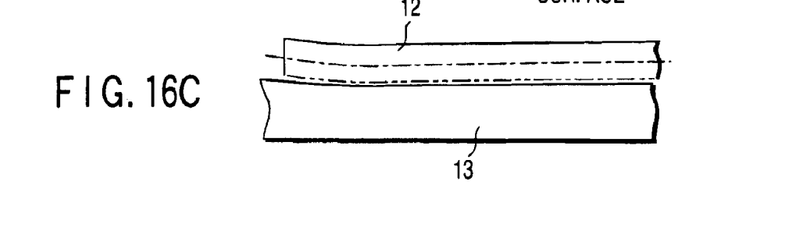

FIGS. 15A to 15C are schematic side views illustrating a grinding stone of the fixed abrasive grain and a wafer having a warp. FIGS. 16A to 16C are schematic side views illustrating the polishing pad used in the inventive CMP process and a wafer having a warp.

As shown in FIGS. 15A and 16A, a wafer 12 is not flat, but normally has a small warp. When such a warped wafer is brought into contact with a polishing pad of high modulus or a grinding stone 113 of fixed abrasive grain type shown in FIG. 15B, the warp-based concave surface of the wafer 12 will come into contact with the grinding stone 113. The grinding stone 13 and the high-modulus polishing pad are difficult to deform because they are hard. When a CMP process is performed under such a condition, the concave surface of the wafer will be polished greatly, resulting in global overpolishing shown in FIG. 15C.

In contrast, the polishing pad 13 used in the inventive CMP process is soft like normal polishing pads before the viscosity modifier is supplied. For this reason, when the warped wafer 12 is brought into contact with the polishing pad 13, the pad deforms to conform to the warp of the wafer as shown in FIG. 16B. For example, the polishing pad 13 deforms to conform to loci drawn by the concave surface of the wafer 12 according to the rotation of the pad and the wafer.

After the deformation of the polishing pad 13, the viscosity modifier 30 is supplied to the polishing pad, thereby hardening the top portion of the pad 13 to a given hardness. Thus, the polishing pad 13 has its top portion hardened in a state where it has deformed to conform to the warp of the wafer 12.

The hardness of the top portion of the polishing pad 13 can be kept at a given hardness (or softness) or adjusted even during the CMP process as a result of being supplied with the viscosity modifier during the CMP process. Thus, it is possible to ensure that the polishing pad 13 conforms to the warp of the wafer 12 at all times during rotation. It therefore becomes possible to prevent the warp-based concave surface of the wafer from being overpolished as shown in FIG. 16C (for comparison, see FIG. 15C).

Thus, in comparison with the case where a polishing pad of high modulus or a grinding stone of fixed abrasive grain type is used, the present embodiment can provide further advantages that the scratches can be kept from increasing, the occurrence of global overpolishing can be avoided, and the global flatness can be ensured.

In addition, that the polishing pad 13 slips on the slurry layer allows CMP even in portions low in structural strength.

An example of a portion low in structural strength is a damascene structure when a low-permittivity insulating film is used as an interlayer insulating film. The low-permittivity insulating film refers to one in which its permittivity can be made lower than that of a CVD-deposited silicon dioxide film (CVD-$SiO_2$) which is generally used as an interlayer insulating film. Specific examples include spin-coating (called SOG: Spin-on-Glass)-based silicon dioxide films (SOG-$SiO_2$) and polyimide films. The permittivity of SOG-$SiO_2$ is about 2.9 and the permittivity of polyimide is about 3.4, which are lower than the permittivity of CVD-$SiO_2$ (about 4.1). The SOG-$SiO_2$ and polyimide are lower in strength than the CVD-$SiO_2$. Thus, the damascene structure using such a low-permittivity insulating film as an interlayer insulating film is low in strength. For this reason, with conventional CMP, metal interconnections that fill wiring trenches formed in a low-permittivity insulating film may become distorted.

In contrast, according to the inventive CMP, since the polishing pad 13 slips on a layer of slurry 20 after the polished surface 23 has been flattened, the force applied to the polished surface 23 diminishes. Thus, it becomes possible to prevent the metal interconnections from becoming distorted.

Thus, the present embodiment provides an advantage that the CMP is allowed even in portions low in structural strength.

Hereinafter, some modifications of the present invention will be described.

Figures 17, 18:
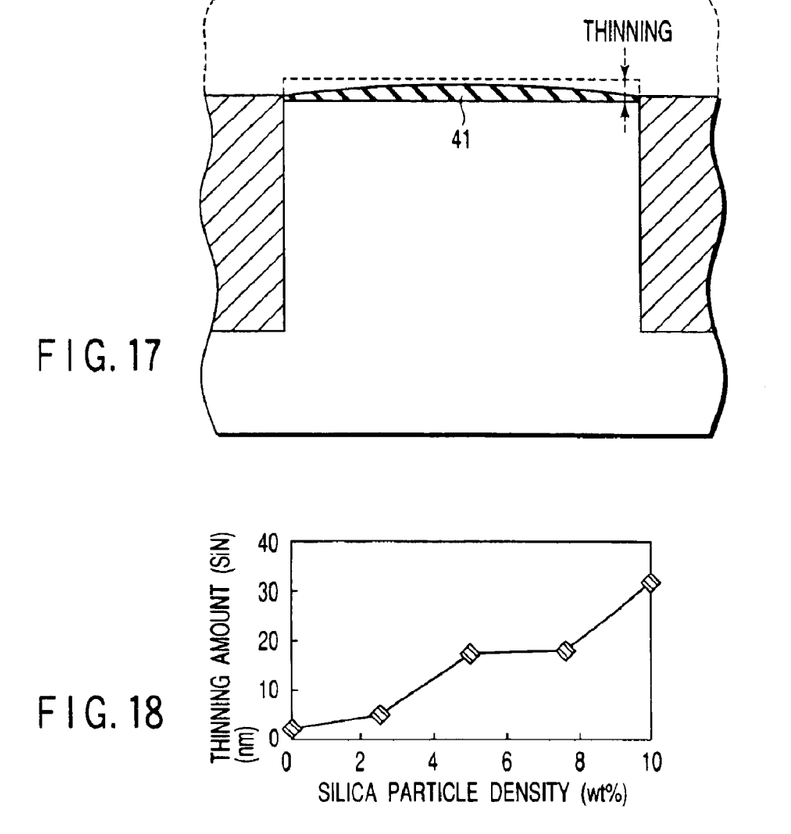
FIG. 17 is a sectional view of a semiconductor device illustrating thinning.
FIG. 18 shows a plot of the amount by which silicon nitride is thinned against the silica grain density in the CMP process of the present invention.

First, the prevention of "thinning" will be described. The thinning is a phenomenon by which, for example, the stopper film 41 is scraped as shown in FIG. 17. If the stopper film is scraped off, then the processing of the CMP will be degraded considerably.

FIG. 18 is a graph of the amount by which silicon nitride is removed by thinning (the amount of thinning) versus silica particle density in the inventive CMP. As shown in FIG. 18 a tendency was confirmed that the amount of thinning for silicon nitride (stopper film) decreased with decreasing density of silica particles.

In practice, the density of silica particles is adjusted according to a permissible range of the amount of thinning. For example, when the permissible range is within 20 nm, the density of silica particles is desired to be less than 8 wt %.

Next, the polishing rate and the in-plane uniformity will be described.

Figure 19:
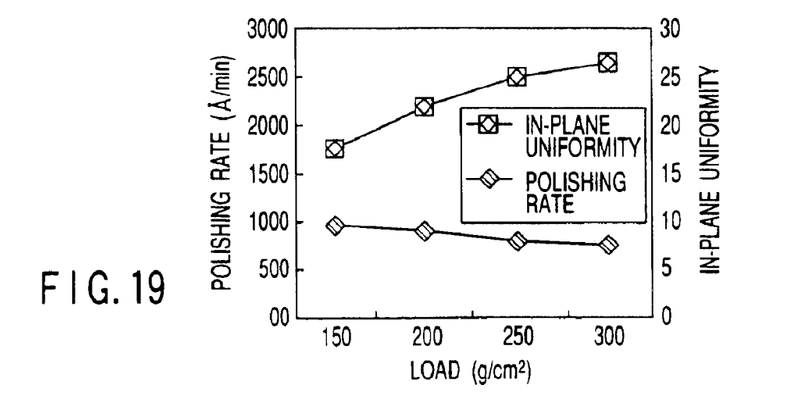
FIG. 19 shows plots of the polishing rate and in-plane uniformity against the load in the CMP process of the present invention.

FIG. 19 is a graph of the polishing rate and the in-plane uniformity versus load. As shown in FIG. 19, a tendency was confirmed that the polishing rate and the in-plane uniformity increased with increasing load applied to the wafer 12. From the results shown in FIG. 19, it is desired that the load applied to the wafer be about 300 g/cm$^2$.

Next, a description is given of the slurry.

In the aforementioned embodiment, an inorganic alkaline solution is used as a solvent. However, a similar phenomenon was confirmed even with an organic alkaline solution.

Figure 20A:
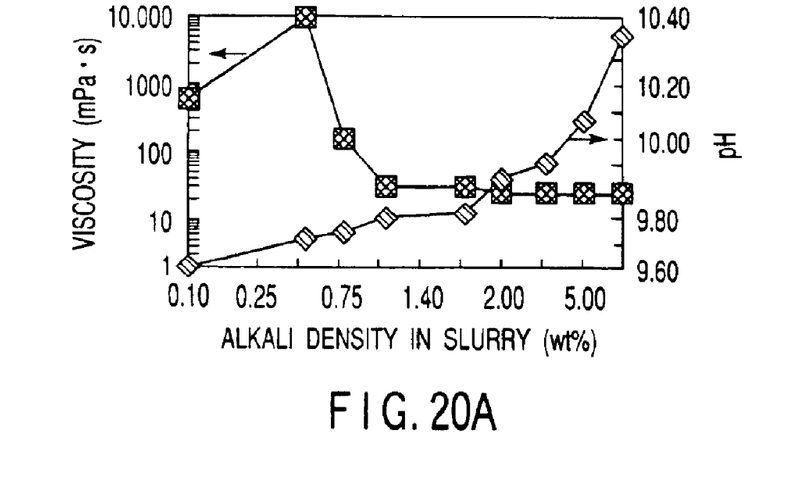
FIG. 20A shows plots of the slurry viscosity and the slurry pH against the alkali density in a slurry (organic alkaline solution)

FIG. 20A shows the characteristics of an organic alkaline solution.

As shown in FIG. 20A, even with an organic alkaline solution added with hydroxycellulose, a tendency was confirmed that the viscosity increased abruptly when the alkali density decreased below about 1 wt %. The organic alkaline solution used is a triethanolamine solution. The tendency shown in FIG. 20A is similar to that shown in FIG. 12. Even in the case where an organic alkaline solution that contains abrasive grains and an additive for making the viscosity variable is used as a slurry, therefore, similar advantages to those in the aforementioned embodiment can be obtained.

Figure 20B:
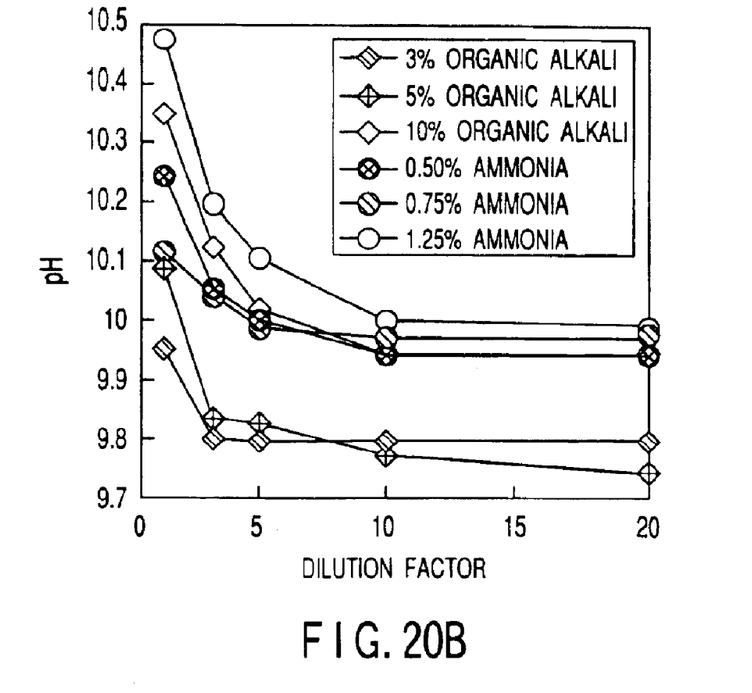
FIG. 20B shows plots of the pH against the factor of dilution by pure water in the organic alkaline solution.

FIG. 20B is a graph of the pH versus the factor of dilution with pure water. In FIG. 20B, the pH of each of 3%, 5% and 10% organic alkaline solutions (triethanolamine solutions) and 0.50%, 0.75% and 1.25% ammonia solutions is plotted against the dilution factor. The densities of colloidal silica and hydroxycellulose were set to 10 wt % and 0.25 wt %, respectively.

As shown in FIG. 20B, a tendency was confirmed that the pH was decreased by dilution with pure water and, with the dilution factor of 10 or more, the pH was decreased to 10 or less. Even when the alkali density is varied in this way, a tendency is obtained which is similar to those shown in FIGS. 12 and 20A. Thus, the alkali density can be varied variously according to processes.

The slurry is not limited to the inorganic alkaline solutions added with hydroxycellulose and the organic alkaline solution added with hydroxycellulose. Any slurry can be used in the inventive CMP process provided that it has such a characteristic as shown in FIG. 12 or 20A.

Although, in the aforementioned embodiment, alkaline solutions are used because polysilicon is polished, acidic solutions can be used. Acidic solutions are mainly used for polishing metal such as aluminum. Any acidic slurry can be used in the inventive CMP provided that it has such a tendency as shown in FIG. 12 or 20A. The alkaline solutions are effective in performing CMP on not only polysilicon but also low-permittivity insulating films such as $SOG-SiO_2$.

In the aforementioned embodiment, cellulose (hydroxycellulose) is used as an additive for making the slurry viscosity variable. In addition to the cellulose, a water-soluble high polymer, polysaccharide, or surface active agent can be used as the additive for making the viscosity variable.

Specific examples of practicable cellulose include hydroxycellulose, methylcellulose, etc. Specific examples of practicable water-soluble high-polymers include polyvinyl pyrrolidone(PVP), polyvinyl alcohol(PVA), etc.

Specific examples of practicable polysaccharide include chitosan, etc.

Although colloidal silica was used as abrasive grains, this is not restrictive. Specific examples of practicable abrasive grains include silicon nitride. An example of a slurry in which silicon nitride is used as abrasive grains is a mixture of maleic anhydride, silicon nitride, and polyvinyl pyrrolidone.

A slurry in which particles of silicon nitride as abrasive grains and polyvinyl pyrrolidone as an additive for making the viscosity variable are mixed in maleic anhydride as a solvent can provide similar advantages to those of the aforementioned embodiment.

According to the present invention, as described above, a semiconductor manufacturing method can be provided which permits the dishing to be controlled while keeping the scratches from increasing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chemical/mechanical polishing method of polishing a surface of a semiconductor device, comprising:

chemically/mechanically polishing the surface of the semiconductor device with a polishing pad soaked with a slurry containing a solvent, abrasive grains mixed therewith, and an additive, the additive being at least one selected from the group consisting of cellulose, polysaccharide, water-soluble high polymer, and surface active agent;

diluting the slurry, with which the polishing pad is soaked, with water, thereby modifying viscosity of the slurry; and chemically/mechanically polishing the surface of the semiconductor device with the polishing pad soaked with the slurry whose viscosity has been modified.

2. The chemical/mechanical polishing method according to claim 1, wherein the additive is a surface active agent.

3. The chemical/mechanical polishing method according to claim 1, wherein the solvent is an alkaline one.

4. The chemical/mechanical polishing method according to claim 1, wherein the solvent is an acidic one.

5. The chemical/mechanical polishing method according to claim 1, wherein the semiconductor device comprises a substrate, a stopper film formed on the substrate, and a film formed in a groove provided in the stopper film and the substrate.

6. A chemical/mechanical polishing method of polishing a surface of a semiconductor device, comprising:

supplying a slurry between a polishing surface of a polishing pad and the surface of the semiconductor device; and chemically/mechanically polishing a film formed in a groove provided in a substrate and a stopper film of the semiconductor device, the stopper film being formed on the substrate, wherein the slurry contains a solvent, abrasive grains mixed therewith, and an additive which is at least one selected from the group consisting of cellulose, polysaccharide, water-soluble high polymer, and surface active agent, and water is added to the slurry supplied between the polishing surface of the polishing pad and the surface of the semiconductor device, thereby modifying viscosity of the slurry, during the chemically/mechanically polishing.

7. A chemical/mechanical polishing method according to claim 6, wherein water is added to the slurry before the film is so removed as to expose the stopper film.

8. A chemical/mechanical polishing method according to claim 6, wherein the additive is a surface active agent.

9. A chemical/mechanical polishing method according to claim 6, wherein the solvent is an alkaline one.

10. A chemical/mechanical polishing method according to claim 6, wherein the solvent is an acidic one.

* * * * *